United States Patent
Lakshmanan et al.

(10) Patent No.: US 7,189,658 B2
(45) Date of Patent: Mar. 13, 2007

(54) STRENGTHENING THE INTERFACE BETWEEN DIELECTRIC LAYERS AND BARRIER LAYERS WITH AN OXIDE LAYER OF VARYING COMPOSITION PROFILE

(75) Inventors: Annamalai Lakshmanan, Santa Clara, CA (US); Deenesh Padhi, Sunnyvale, CA (US); Ganesh Balasubramanian, Sunnyvale, CA (US); Zhenjiang David Cui, San Jose, CA (US); Daemian Raj, Sunnyvale, CA (US); Juan Carlos Rocha-Alvarez, Sunnyvale, CA (US); Francimar Schmitt, Santa Clara, CA (US); Bok Hoen Kim, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 162 days.

(21) Appl. No.: 11/123,501

(22) Filed: May 4, 2005

(65) Prior Publication Data
US 2006/0252273 A1    Nov. 9, 2006

(51) Int. Cl.
H01L 21/31 (2006.01)
(52) U.S. Cl. .................. 438/758; 438/758; 438/787; 438/789; 438/931; 257/E21.277
(58) Field of Classification Search .................. None
See application file for complete search history.

(56) References Cited

U.S. PATENT DOCUMENTS

| 5,271,972 | A | 12/1993 | Kwok et al. |
|---|---|---|---|
| 6,068,884 | A | 5/2000 | Rose et al. |
| 6,159,871 | A | 12/2000 | Loboda et al. |
| 6,251,770 | B1 | 6/2001 | Uglow et al. |
| 6,350,670 | B1 | 2/2002 | Andideh et al. |
| 6,362,091 | B1 | 3/2002 | Andideh et al. |
| 6,521,302 | B1 | 2/2003 | Campana-Schmitt et al. |
| 6,570,256 | B2 | 5/2003 | Conti et al. |
| 6,593,247 | B1 | 7/2003 | Huang et al. |
| 6,627,532 | B1 | 9/2003 | Gaillard et al. |
| 6,740,539 | B2 | 5/2004 | Conti et al. |
| 6,756,674 | B1 | 6/2004 | Catabay et al. |
| 6,784,119 | B2 | 8/2004 | Gaillard et al. |
| 6,806,207 | B2 | 10/2004 | Huang et al. |
| 6,844,612 | B1 | 1/2005 | Tian et al. |
| 6,849,561 | B1 | 2/2005 | Goundar et al. |
| 6,887,760 | B2 | 5/2005 | Andideh et al. |

(Continued)

OTHER PUBLICATIONS

U.S. Appl. No. 11/142,124, filed on Jun. 1, 2005 (APPM/009516).

*Primary Examiner*—Michael Lebentritt
*Assistant Examiner*—Kyoung Lee
(74) *Attorney, Agent, or Firm*—Patterson and Sheridan

(57) ABSTRACT

A method of processing a substrate including depositing a transition layer and a dielectric layer on a substrate in a processing chamber are provided. The transition layer is deposited from a processing gas including an organosilicon compound and an oxidizing gas. The flow rate of the organosilicon compound is ramped up during the deposition of the transition layer such that the transition layer has a carbon concentration gradient and an oxygen concentration gradient. The transition layer improves the adhesion of the dielectric layer to an underlying barrier layer on the substrate.

20 Claims, 3 Drawing Sheets

U.S. PATENT DOCUMENTS

| | | |
|---|---|---|
| 6,902,440 B2 | 6/2005 | Dougan et al. |
| 6,903,004 B1 | 6/2005 | Spencer et al. |
| 6,913,992 B2 | 7/2005 | Schmitt et al. |
| 2004/0048490 A1 | 3/2004 | Tsuji et al. |
| 2004/0076767 A1 | 4/2004 | Satoh et al. |
| 2004/0155340 A1 | 8/2004 | Owada et al. |
| 2004/0166665 A1 | 8/2004 | Gaillard et al. |
| 2004/0253388 A1 | 12/2004 | Kim |
| 2005/0009320 A1 | 1/2005 | Goundar |
| 2005/0026422 A1 | 2/2005 | Kim et al. |
| 2005/0051900 A1 | 3/2005 | Liu et al. |
| 2005/0059258 A1 | 3/2005 | Edelstein et al. |
| 2005/0118799 A1 | 6/2005 | Wu |
| 2005/0130405 A1 | 6/2005 | Spencer et al. |
| 2005/0140029 A1 | 6/2005 | Li et al. |
| 2005/0202685 A1 | 9/2005 | Huang et al. |
| 2005/0208759 A1 | 9/2005 | Campana-Schmitt et al. |
| 2006/0189162 A1 | 8/2006 | Huang et al. |

STRENGTHENING THE INTERFACE BETWEEN DIELECTRIC LAYERS AND BARRIER LAYERS WITH AN OXIDE LAYER OF VARYING COMPOSITION PROFILE

BACKGROUND OF THE INVENTION

1. Field of the Invention

Embodiments of the present invention generally relate to the fabrication of integrated circuits. More particularly, embodiments of the present invention relate to a method for depositing a dielectric layer on a barrier layer.

2. Description of the Related Art

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.13 µm and even 0.1 µm feature sizes, and tomorrow's plants soon will be producing devices having even smaller geometries.

In order to further reduce the size of devices on integrated circuits, it has become necessary to use conductive materials having low resistivity and to use insulators having low dielectric constants (k<4) to reduce the capacitive coupling between adjacent metal lines. Recent developments in low dielectric constant films have focused on incorporating silicon (Si), carbon (C), and oxygen (O) atoms into the deposited films to provide organosilicate films, such as silicon oxycarbide films.

The development of silicon oxycarbide films having both a low dielectric constant and desirable chemical and mechanical properties has been challenging. For example, it has been observed that silicon oxycarbide films having a desirably low dielectric constant less than 3.0 or less than 2.5 often do not adhere well to an underlying barrier layer, such as a silicon and carbon-containing barrier layer, during subsequent substrate processing. Some substrate processing techniques apply forces to the substrate that can increase layering defects, such as layer delamination. For example, excess copper containing materials may be removed by mechanical abrasion between a substrate and a polishing pad in a chemical mechanical polishing process, and the force between the substrate and the polishing pad may induce stresses in the deposited silicon oxycarbide films that result in delamination of the silicon oxycarbide films from adjacent layers. In another example, annealing of deposited materials may induce high thermal stresses that can also lead to delamination of silicon oxycarbide films.

Thus, there remains a need for a method of improving the adhesion of low dielectric constant silicon oxycarbide films to adjacent layers.

SUMMARY OF THE INVENTION

The present invention generally provides a method of depositing a dielectric layer, the method comprising introducing a processing gas comprising an organosilicon compound and an oxidizing gas into a chamber at a first organosilicon compound to oxidizing gas flow rate ratio of at least about 1:40, turning on RF power in the chamber, depositing a transition layer on a substrate in the chamber while ramping up the flow rate of the organosilicon compound into the chamber to provide a second organosilicon compound to oxidizing gas flow rate ratio, and depositing a dielectric layer comprising silicon, oxygen, and carbon on the transition layer for a period of time while maintaining the second organosilicon compound to oxidizing gas flow rate ratio. The transition layer has an oxygen concentration gradient and a carbon concentration gradient. The transition layer improves the adhesion of the dielectric layer to an underlying layer on the substrate.

In one embodiment, the first organosilicon compound to oxidizing gas flow rate ratio is between about 1:40 and about 1:5, and the second organosilicon compound to oxidizing gas flow rate ratio is between about 1:2 and about 3:1.

In another embodiment, the transition layer is deposited while ramping up the flow rate of the organosilicon compound into the chamber at a ramp rate between about 200 mg/min/sec and about 3000 mg/min/sec. The transition layer may be deposited to a thickness between about 80 Å and about 500 Å.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide a method of depositing a transition layer on a substrate and a dielectric layer on the transition layer. The transition layer comprises silicon, carbon, and oxygen and has an oxygen concentration gradient such that a surface of the transition layer that contacts the dielectric layer has a lower oxygen concentration than a surface of the transition layer that contacts the underlying substrate. The transition layer also has a carbon concentration gradient such that a surface of the transition layer that contacts the dielectric layer has a higher carbon concentration than a surface of the transition layer that contacts the underlying substrate. The transition layer improves the adhesion between the dielectric layer and the substrate, which may include a barrier layer thereon.

Figure 1:
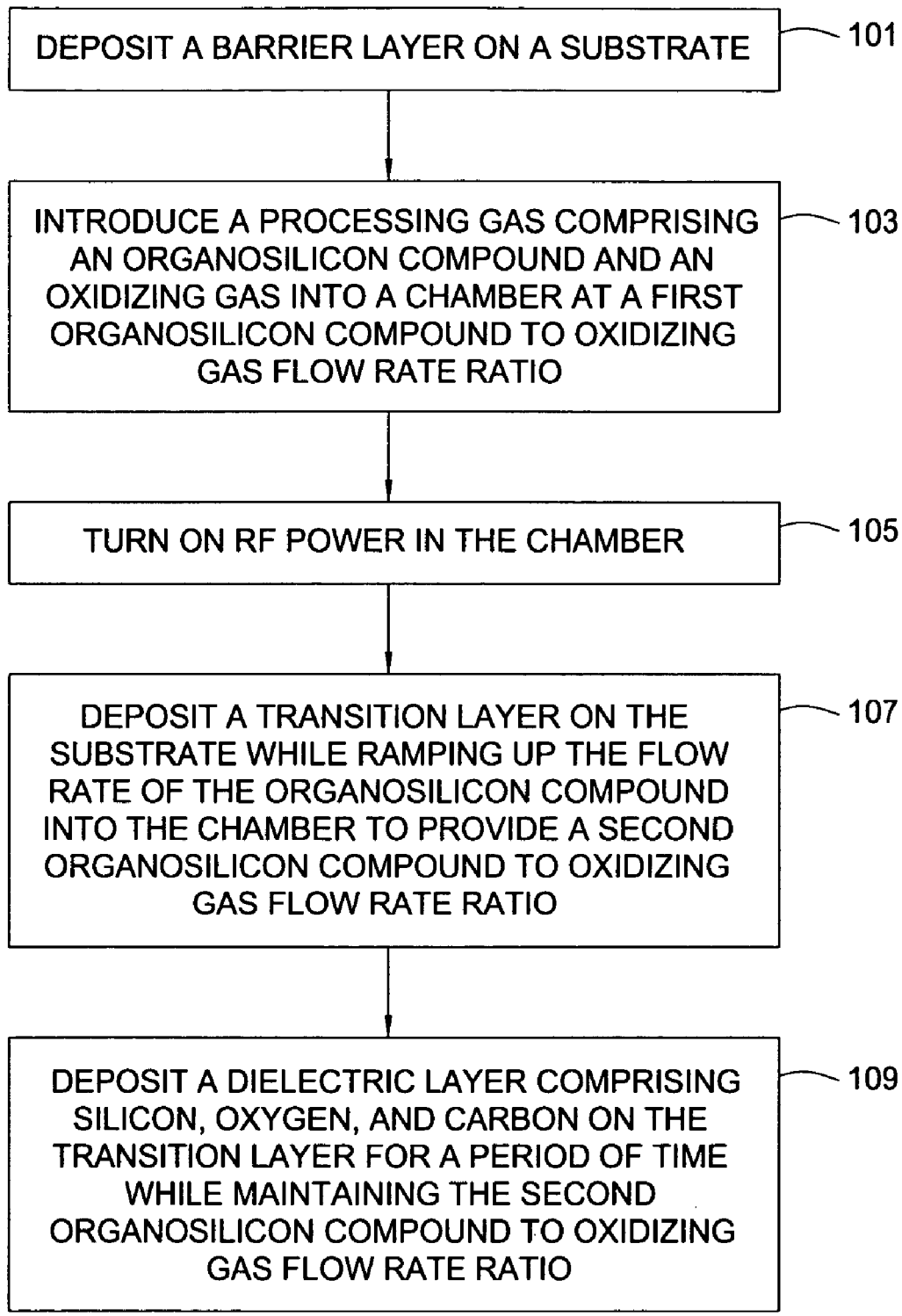
FIG. 1 is a process flow diagram illustrating a method according to an embodiment of the invention.

FIG. 1 is a process flow diagram summarizing an embodiment of the invention. In step 101, a barrier layer is deposited on a substrate. The barrier layer may be a silicon carbide, nitrogen-doped silicon carbide, oxygen-doped silicon carbide, or oxygen and nitrogen-doped silicon carbide layer. An example of a process for depositing a nitrogen-doped silicon carbide layer is disclosed in U.S. patent application Ser. No. 09/793,818, filed on Feb. 23, 2001, now issued as U.S. Pat. No. 6,537,733, which is incorporated by reference herein. An example of a process for depositing an oxygen-doped silicon carbide layer is disclosed in U.S. patent application Ser. No. 10/196,498, filed on Jul. 15, 2002, which is incorporated by reference herein. Generally, the barrier layer may be deposited by a vapor deposition process, such as a plasma enhanced chemical vapor deposition process that uses RF power.

In step 103, a processing gas comprising an organosilicon compound and an oxidizing gas is introduced into a processing chamber at a first organosilicon compound to oxidizing gas flow rate ratio. The first organosilicon compound to oxidizing gas flow rate ratio is at least about 1:40. The first organosilicon compound to oxidizing gas flow rate ratio may be between about 1:40 and about 1:5, e.g., about 1:10. The organosilicon compound may be introduced into the processing chamber at a flow rate between about 100 sccm and about 500 sccm, and the oxidizing gas may be introduced into the processing chamber at a flow rate between about 10 sccm and about 1000 sccm. The organosilicon compound and the oxidizing gas are flowed into the chamber for a period of time sufficient to stabilize the chamber pressure, e.g., between about 5 seconds and about 30 seconds.

The processing gas may comprise additional components, e.g., a carrier gas, such as an inert gas, such as helium. The processing gas may also comprise additional organosilicon compounds, additional oxidizing gases, and/or hydrocarbons or hydrocarbon-based compounds.

In step 105, RF power is turned on in the chamber. The RF power may be applied to a gas distribution manifold or showerhead in the chamber (described further below with respect to FIG. 2), wherein the showerhead acts as a powered electrode. The RF power may be applied at a single or mixed frequency to enhance decomposition of gases introduced into the chamber. Alternatively, or additionally, RF power can be provided to the substrate support in the chamber, with the substrate support serving as a cathode in the chamber. The RF power to the chamber may be cycled or pulsed to reduce heating of the substrate and promote greater porosity in the deposited film. When single frequency RF power is used, e.g., between about 500 kHz and about 13.56 MHz, a power between about 50 W and about 3000 W can be applied to the gas distribution manifold for processing a 300 mm substrate. When mixed frequency RF power is used, e.g., a low frequency RF (LFRF) power of about 200 kHz to about 2 MHz at about 50 W to about 1000 W may be used and a high frequency RF (HFRF) power of about 500 kHz to about 13.56 MHz at about 50 W and about 3000 W may be used for a 300 mm substrate.

In step 107, a transition layer is deposited on the substrate in the chamber while ramping up the flow rate of the organosilicon compound into the chamber to provide a second organosilicon compound to oxidizing gas flow rate ratio. Preferably, the flow rate of the organosilicon compound is ramped up immediately after the RF power is turned on such that the transition layer is deposited directly on the substrate, i.e., without the deposition of an intermediate layer between the substrate and the transition layer. The flow rate of the organosilicon compound into the chamber may be ramped up at a ramp rate of between about 200 mg/min/sec and about 3000 mg/min/sec. The second organosilicon compound to oxidizing gas flow rate ratio may be between about 1:1 and about 3:1, e.g., about 1.7:1. The transition layer may be deposited for a period of time sufficient to provide a transition layer thickness between about 80 Å and about 500 Å.

Preferably, the flow rate of the oxidizing gas into the chamber is maintained at a substantially constant flow rate during the deposition of the transition layer. However, the flow rate of the oxidizing gas and/or the flow rate of an optional carrier gas may be adjusted during the deposition of the transition layer to maintain a substantially constant chamber pressure during the deposition of the transition layer. The RF power to the chamber is maintained during the deposition of the transition layer. In one aspect, the RF power may be maintained at the frequencies and power levels described above with respect to step 105.

During the deposition of the transition layer, the substrate may be maintained at a temperature between about 150° C. and about 500° C., preferably between about 250° C. and about 450° C. The deposition pressure is typically between about 1 Torr and about 10 Torr, preferably between about 3 Torr and about 7 Torr. The spacing between the substrate and the showerhead may be between about 200 mils and about 1200 mils.

In step 109, a dielectric layer comprising silicon, oxygen, and carbon is deposited on the transition layer for a period of time while maintaining the second organosilicon compound to oxidizing gas flow rate ratio. Preferably, the dielectric layer is a low dielectric constant silicon oxycarbide film having a dielectric constant of about 3.0 or less. The dielectric layer may be used at different levels within a semiconductor device. For example, the dielectric layer may be used as a premetal dielectric layer, an intermetal dielectric layer, or a gate dielectric layer. The dielectric layer may be deposited for a period of time sufficient to provide a thickness between about 1000 Å and about 9000 Å. During the deposition of the dielectric layer, the substrate may be maintained at the same or a substantially similar temperature used during the deposition of the transition layer. The chamber pressure and the spacing between the substrate and the showerhead may also be maintained at the same or substantially similar values during the deposition of the transition layer and the dielectric layer. The organosilicon compound may be flowed into the chamber at a rate between about 100 sccm and about 1000 sccm, and the oxidizing gas may be flowed into the chamber at a rate between about 50 sccm and about 2000 sccm during the deposition of the dielectric layer. A carrier gas may be flowed into the chamber at a rate between about 500 sccm and about 5000 sccm during the deposition of the dielectric layer.

Optionally, following deposition of the dielectric layer, the dielectric layer may be post-treated, e.g., cured with heat, an electron beam (e-beam), or UV exposure. Post-treating the layer supplies energy to the film network to volatize and remove at least a portion of the organic groups, such as organic cyclic groups in the film network, leaving behind a more porous film network having a lower dielectric constant than an untreated film.

Figure 2:
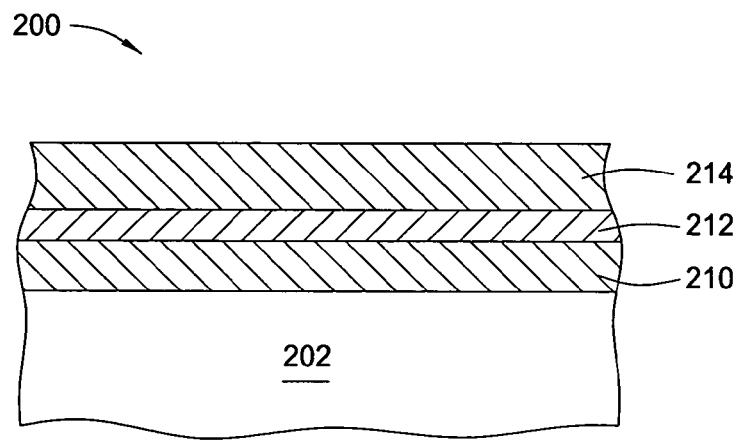
FIG. 2 is a cross-sectional view of structure including a transition layer and a dielectric layer formed according to embodiments of the invention.

FIG. 2 schematically illustrates a cross-sectional view of a structure including layers formed according to embodiments of the invention. Structure 200 includes a barrier layer 210 that is deposited on a substrate 202. The substrate 202 may be a conductive, semiconductive, or insulating layer. As described above, the barrier layer 210 may be a silicon carbide, nitrogen-doped silicon carbide, oxygen-doped silicon carbide, or oxygen and nitrogen-doped silicon carbide layer. The structure 200 also includes a thin transition layer 212 deposited on the barrier layer 210 and a dielectric layer 214 on the transition layer 212. The transition layer 212 and dielectric layer 214 are deposited according to embodiments of the invention.

Figure 3:
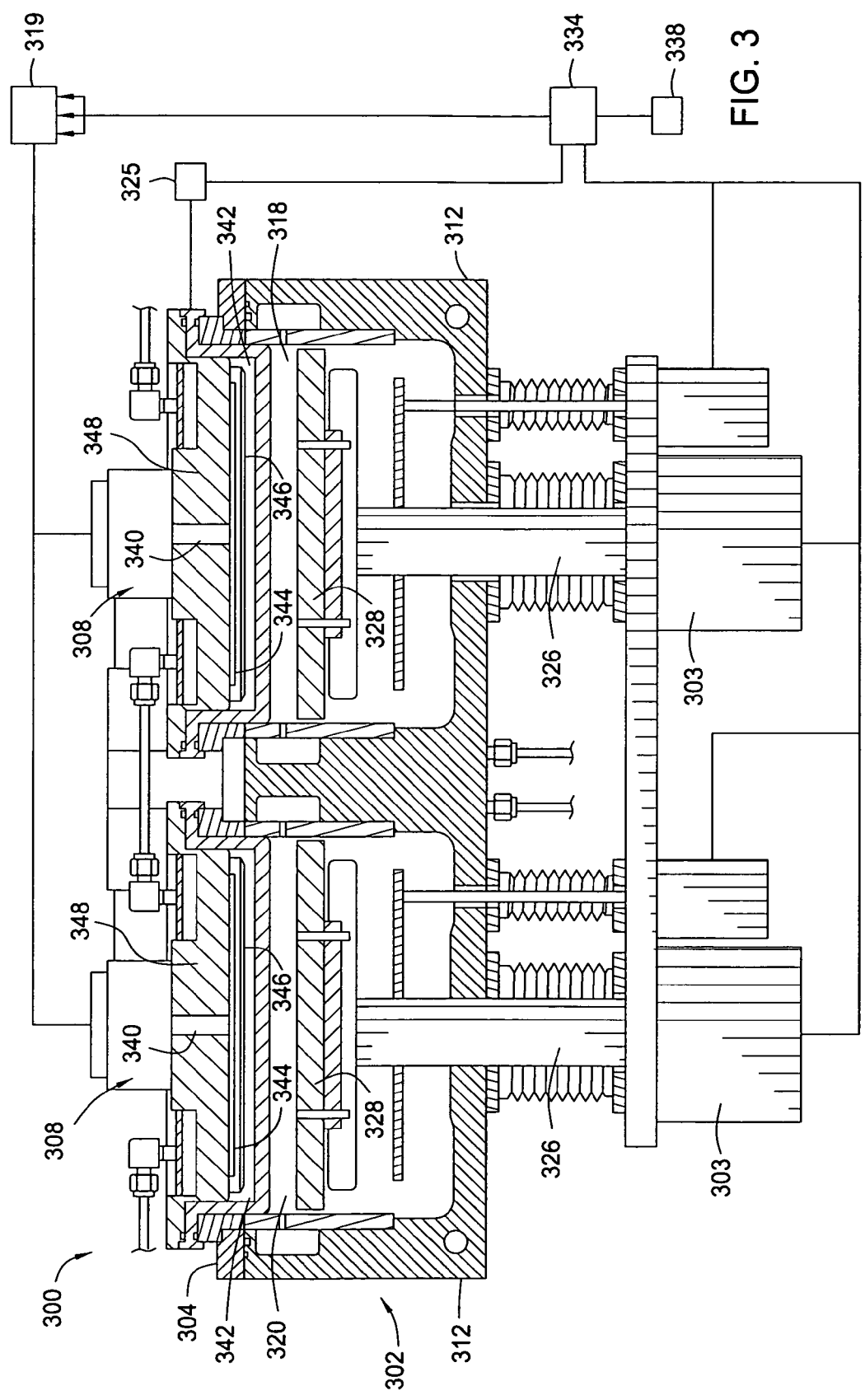
FIG. 3 is a cross-sectional schematic diagram of an exemplary processing chamber that may be used for practicing embodiments of the invention.

FIG. 3 is a cross-sectional, schematic diagram of a chemical vapor deposition (CVD) chamber 300 for depositing layers according to embodiments of the invention. An example of such a chamber is a dual or twin chamber on a PRODUCER® system, available from Applied Materials, Inc. of Santa Clara, Calif. The twin chamber has two isolated processing regions (for processing two substrates, one substrate per processing region) such that the flow rates experienced in each region are approximately one half of the flow rates into the whole chamber. The flow rates described in the example below and throughout the specification are the flow rates per 300 mm substrate. A chamber having two isolated processing regions is further described in U.S. Pat. No. 5,855,681, which is incorporated by reference herein. Another example of a chamber that may be used is a DxZ® chamber on a CENTURA® system, both of which are available from Applied Materials, Inc.

The chamber 300 has a body 302 that defines separate processing regions 318, 320. Each processing region 318, 320 has a pedestal 328 for supporting a substrate (not shown) within the chamber 300. The pedestal 328 typically includes a heating element (not shown). Preferably, the pedestal 328 is movably disposed in each processing region 318, 320 by a stem 326 which extends through the bottom of the chamber body 302 where it is connected to a drive system 303.

Each of the processing regions 318, 320 also preferably includes a gas distribution assembly 308 disposed through a chamber lid 304 to deliver gases into the processing regions 318, 320. The gas distribution assembly 308 of each processing region normally includes a gas inlet passage 340 which delivers gas from a gas flow controller 319 into a showerhead assembly 342. Gas flow controller 319 is typically used to control and regulate the flow rates of different process gases into the chamber. Other flow control components may include a liquid flow injection valve and liquid flow controller (not shown) if liquid precursors are used. The showerhead assembly 342 comprises an annular base plate 348, a face plate 346, and a blocker plate 344 between the base plate 348 and the face plate 346. The showerhead assembly 342 includes a plurality of nozzles (not shown) through which gaseous mixtures are injected during processing. An RF (radio frequency) source 325 provides a bias potential to the showerhead assembly 342 to facilitate generation of a plasma between the showerhead assembly 342 and the pedestal 328. During a plasma-enhanced chemical vapor deposition process, the pedestal 328 may serve as a cathode for generating the RF bias within the chamber body 302. The cathode is electrically coupled to an electrode power supply to generate a capacitive electric field in the deposition chamber 300. Typically an RF voltage is applied to the cathode while the chamber body 302 is electrically grounded. Power applied to the pedestal 228 creates a substrate bias in the form of a negative voltage on the upper surface of the substrate. This negative voltage is used to attract ions from the plasma formed in the chamber 300 to the upper surface of the substrate.

During processing, process gases are uniformly distributed radially across the substrate surface. The plasma is formed from one or more process gases or a gas mixture by applying RF energy from the RF power supply 325 to the showerhead assembly 342, which acts as a powered electrode. Film deposition takes place when the substrate is exposed to the plasma and the reactive gases provided therein. The chamber walls 312 are typically grounded. The RF power supply 325 can supply either a single or mixed-frequency RF signal to the showerhead assembly 342 to enhance the decomposition of any gases introduced into the processing regions 318, 320.

A system controller 334 controls the functions of various components such as the RF power supply 325, the drive system 303, the lift mechanism 305, the gas flow controller 319, and other associated chamber and/or processing functions. The system controller 334 executes system control software stored in a memory 338, which in the preferred embodiment is a hard disk drive, and can include analog and digital input/output boards, interface boards, and stepper motor controller boards. Optical and/or magnetic sensors are generally used to move and determine the position of movable mechanical assemblies.

The above CVD system description is mainly for illustrative purposes, and other plasma processing chambers may also be employed for practicing embodiments of the invention.

In any of the embodiments described herein, the organosilicon compound used to deposit the transition layer and the dielectric layer may be an organosiloxane, an organosilane, or a combination thereof. The term "organosilicon compound" as used herein is intended to refer to silicon-containing compounds including carbon atoms in organic groups, and can be cyclic or linear. Organic groups may include alkyl, alkenyl, cyclohexenyl, and aryl groups in addition to functional derivatives thereof. Preferably, the organosilicon compounds include one or more carbon atoms attached to a silicon atom such that the carbon atoms are not readily removed by oxidation at suitable processing conditions. The organosilicon compounds may also preferably include one or more oxygen atoms.

Suitable cyclic organosilicon compounds include a ring structure having three or more silicon atoms, and optionally one or more oxygen atoms. Commercially available cyclic organosilicon compounds include rings having alternating silicon and oxygen atoms with one or two alkyl groups bonded to the silicon atoms. Some exemplary cyclic organosilicon compounds include:

| | |
|---|---|
| 1,3,5-trisilano-2,4,6-trimethylene, | —(—SiH$_2$CH$_2$—)$_3$— (cyclic) |
| 1,3,5,7-tetramethylcyclotetrasiloxane (TMCTS), | —(—SiHCH$_3$—O—)$_4$— (cyclic) |
| octamethylcyclotetra-siloxane (OMCTS), | —(—Si(CH$_3$)$_2$—O—)$_4$— (cyclic) |
| 1,3,5,7,9-pentamethylcyclopentasiloxane, | —(—SiHCH$_3$—O—)$_5$— (cyclic) |
| 1,3,5,7-tetrasilano-2,6-dioxy-4,8-dimethylene, | —(—SiH$_2$—CH$_2$—SiH$_2$—O—)$_2$— (cyclic) |
| hexamethylcyclotrisiloxane, | —(—Si(CH$_3$)$_2$—O—)$_2$— (cyclic). |

Suitable linear organosilicon compounds include aliphatic organosilicon compounds having linear or branched structures with one or more silicon atoms and one or more carbon atoms. The organosilicon compounds may further include one or more oxygen atoms. Some exemplary linear organosilicon compounds include:

| | |
|---|---|
| methylsilane, | $CH_3$—$SiH_3$ |
| dimethylsilane, | $(CH_3)_2$—$SiH_2$ |
| trimethylsilane, | $(CH_3)_3$—$SiH$ |
| ethylsilane, | $CH_3$—$CH_2$—$SiH_3$ |
| disilanomethane, | $SiH_3$—$CH_2$—$SiH_3$ |
| bis(methylsilano)methane, | $CH_3$—$SiH_2$—$CH_2$—$SiH_2$—$CH_3$ |
| 1,2-disilanoethane, | $SiH_3$—$CH_2$—$CH_2$—$SiH_3$ |
| 1,2-bis(methylsilano)ethane, | $CH_3$—$SiH_2$—$CH_2$—$CH_2$—$SiH_2$—$CH_3$ |
| 2,2-disilanopropane, | $SiH_3$—$C(CH_3)_2$—$SiH_3$ |
| diethylsilane, | $(C_2H_5)_2$—$SiH_2$ |
| propylsilane, | $C_3H_7$—$SiH_3$ |
| vinylmethylsilane, | $(CH_2CH)$—$SiH_2$—$CH_3$ |
| 1,1,2,2-tetramethyldisilane, | $(CH_3)_2$—$SiH$—$SiH$—$(CH_3)_2$ |
| hexamethyldisilane, | $CH_3)_3$—$Si$—$Si$—$(CH_3)_3$ |
| 1,1,2,2,3,3-hexamethyltrisilane, | $(CH_3)_2$—$SiH$—$Si(CH_3)_2$—$SiH$—$(CH_3)_2$ |
| 1,1,2,3,3-pentamethyltrisilane, | $(CH_3)_2$—$SiH$—$SiH(CH_3)_3SiH$—$(CH_3)_2$ |
| 1,3-bis(methylsilano)propane, | $CH_3$—$SiH_2$—$(CH_2)_3$—$SiH_2$—$CH_3$ |
| 1,2-bis(dimethylsilano)ethane, | $(CH_3)_2$—$SiH$—$(CH_2)_2$—$SiH$—$(CH_3)_2$ |
| 1,3-bis(dimethylsilano)propane, | $(CH_3)_2$—$SiH$—$(CH_2)_3$—$SiH$—$(CH_3)_2$ |
| methyldiethoxysilane (MDEOS) | $CH_3$—$SiH$—$(O$—$CH_2$—$CH_3)_2$ |
| 1,3-dimethyldisiloxane, | $CH_3$—$SiH_2$—$O$—$SiH_2$—$CH_3$ |
| 1,1,3,3-tetramethyldisiloxane, | $(CH_3)_2$—$SiH$—$O$—$SiH$—$(CH_3)_2$ |
| hexamethyldisiloxane (HMDS), | $(CH_3)_3$—$Si$—$O$—$Si$—$(CH_3)_3$ |
| 1,3-bis(silanomethylene)disiloxane, | $(SiH_3$—$CH_2$—$SiH_2$—$)_2$—$O$ |
| bis(1-methyldisiloxanyl)methane, | $(CH_3$—$SiH_2$—$O$—$SiH_2$—$)_2$—$CH_2$ |
| 2,2-bis(1-methyldisiloxanyl)propane, | $(CH_3$—$SiH_2$—$O$—$SiH_2$—$)_2$—$C(CH_3)_2$ |
| dimethyldimethoxysilane (DMDMOS), | $(CH_3O)_2$—$Si$—$(CH_3)_2$ |
| dimethoxymethylvinylsilane (DMMVS), | $(CH_3O)_2$—$Si(CH_3)$—$CH_2$=$CH_3$ |
| phenyldimethoxysilane, | $C_6H_5$—$SiH$—$(O$—$CH_3)_2$ |
| diphenylmethylsilane, | $(C_6H_5)_2$—$SiH$—$CH_3$ |
| dimethylphenylsilane, | $(CH_3)_2$—$SiH$—$C_6H_5$. |

A preferred cyclic organosiloxane is octamethylcyclotetrasiloxane (OMCTS), and a preferred linear organosilane is trimethylsilane.

The organosilicon compounds described herein for the deposition of the transition and dielectric layers may also be used to deposit the barrier layers of the invention.

Oxidizing gases that may be used to deposit the dielectric layers and the transition layers include oxygen ($O_2$), ozone ($O_3$), nitrous oxide ($N_2O$), carbon monoxide (CO), carbon dioxide ($CO_2$), water ($H_2O$), 2,3-butane dione, or combinations thereof. When ozone is used as an oxidizing gas, an ozone generator converts from 6% to 20%, typically about 15%, by weight of the oxygen in a source gas to ozone, with the remainder typically being oxygen. However, the ozone concentration may be increased or decreased based upon the amount of ozone desired and the type of ozone generating equipment used. Disassociation of oxygen or the oxygen containing compounds may occur in a microwave chamber prior to entering the deposition chamber to reduce excessive dissociation of the silicon-containing compounds.

One or more carrier gases may be introduced into the chamber in addition to the one or more organosilicon compounds and the one or more oxidizing gases. Carrier gases that may be used include inert gases such as argon, helium, and combinations thereof.

In one embodiment, one organosilicon compound, one oxidizing gas, and one carrier gas are used to deposit the dielectric layer and the transition layer. In other embodiments, a mixture of one or more organosilicon compounds, one or more oxidizing gases, and one or more carrier gases may be used to deposit the dielectric layer and the transition layer.

Optionally, one or more hydrocarbon compounds may be used in depositing the dielectric layer and the transition layer. For example, in one embodiment, a dielectric layer and the transition layer are deposited from a gas mixture comprising a cyclic organosilicon compound, one or more aliphatic compounds, and one or more oxidizing gases. The one or more aliphatic compounds may include an aliphatic organosilicon compound, an aliphatic hydrocarbon, or a mixture thereof. In one embodiment, the gas mixture comprises octamethylcyclotetrasiloxane, trimethylsilane, ethylene, and oxygen. Further description of the deposition of a low dielectric constant film from such a gas mixture is provided in U.S. patent application Ser. No. 10/121,284, filed Apr. 11, 2002, which is commonly assigned and is incorporated by reference herein.

In another embodiment, a dielectric layer and a transition layer are deposited from a gas mixture including one or more organosilicon compounds, one or more hydrocarbon compounds having at least one cyclic group, and one or more oxidizing gases. For example, the gas mixture may include diethoxymethylsilane, alpha-terpinene, oxygen, and carbon dioxide. Following deposition of the dielectric layer, the dielectric layer may be cured such as with an electron beam treatment to remove pendant organic groups, such as the cyclic groups of the hydrocarbon compounds that have been incorporated into the film network, to create pores in the dielectric layer. Further description of the deposition of a low dielectric constant film deposited from such a gas mixture is provided in U.S. patent application Ser. No. 10/302,393, filed Nov. 22, 2002, which is commonly assigned and is incorporated by reference herein.

Hydrocarbon compounds that may be used include aliphatic hydrocarbon compounds having between one and about 20 adjacent carbon atoms. The hydrocarbon compounds can include adjacent carbon atoms that are bonded by any combination of single, double, and triple bonds. For example, the hydrocarbon compounds may include alkenes and alkylenes having two to about 20 carbon atoms, such as ethylene, propylene, acetylene, and butadiene.

One or more hydrocarbon compounds having a cyclic group may also be used. The term "cyclic group" as used herein is intended to refer to a ring structure. The ring structure may contain as few as three atoms. The atoms may include carbon, silicon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bi-cyclic or tri-cyclic. In one embodiment, the cyclic group is bonded to a linear or branched functional group. The linear or branched functional group preferably contains an alkyl or vinyl alkyl group and has between one and twenty carbon atoms. The linear or branched functional group may also include oxygen atoms, such as in a ketone, ether, and ester. Some exemplary compounds having at least one cyclic group include alpha-terpinene (ATP), norbornadiene, vinylcyclohexane (VCH), and phenylacetate.

The following example illustrates an embodiment of the present invention.

EXAMPLE 1

A nitrogen-doped silicon carbide barrier layer was deposited on a substrate in a chemical vapor deposition chamber that is part of the PRODUCER® integrated platform system, available from Applied Materials, Inc. The substrate was then transferred to another chemical vapor deposition chamber on the PRODUCER® integrated platform system. Octamethylcyclotetrasiloxane (OMCTS), oxygen, and helium were introduced into the chamber, and the chamber pressure was stabilized. The OMCTS was introduced at a flow rate of 70 sccm and the oxygen was introduced at a flow rate of 700 sccm. Thus, the OMCTS and oxygen were introduced into the chamber at an OMCTS:oxygen flow rate ratio of 1:10. The helium was introduced at a flow rate of 1000 sccm. RF power of 500 W at a frequency of 13.56 MHz was then applied to the chamber. After the RF power was turned on, the flow rate of OMCTS into the chamber was ramped up at a ramp rate of 600 mg/min/sec until an OMCTS:oxygen flow rate ratio of 1.7:1 was reached. A transition layer was deposited on the barrier layer while the flow rate of OMCTS was ramped up to obtain an OMCTS:oxygen flow rate ratio of 1.7:1. The transition layer of about 200 Å was deposited at a chamber pressure of 5 Torr, a substrate temperature of 350° C., and a showerhead to substrate spacing of 350 mils. Once the OMCTS:oxygen flow rate ratio of 1.7:1 was achieved, the flow of OMCTS was maintained at a substantially constant flow rate of 270 sccm in the chamber for a period of time in which a dielectric layer of about 5000 Å was deposited on the substrate. The oxygen flow rate during the deposition of the dielectric layer was 160 sccm, and the helium flow rate during the deposition of the dielectric layer was 900 sccm. The chamber pressure, substrate temperature, RF power, and showerhead to substrate spacing were maintained at the same values through the deposition of the transition layer and the dielectric layer.

The interfacial adhesion energy between the barrier layer and the dielectric layer was measured by a four point bend test. An interfacial adhesion energy of 6 joules $(J)/m^2$ between the barrier layer and the dielectric layer was measured.

A comparison example in which a dielectric layer was deposited on a barrier layer without depositing a transition layer as described according to embodiments of the invention was also performed. The barrier layer and dielectric layer were deposited under processing conditions substantially identical to the processing conditions described above with respect to Example 1. The measured interfacial adhesion energy between the barrier layer and the dielectric layer was 3 $J/m^2$. Thus, the deposition of a transition layer according to embodiments of the invention provided a significantly improved adhesion between the barrier layer and the dielectric layer.

Figure 4:
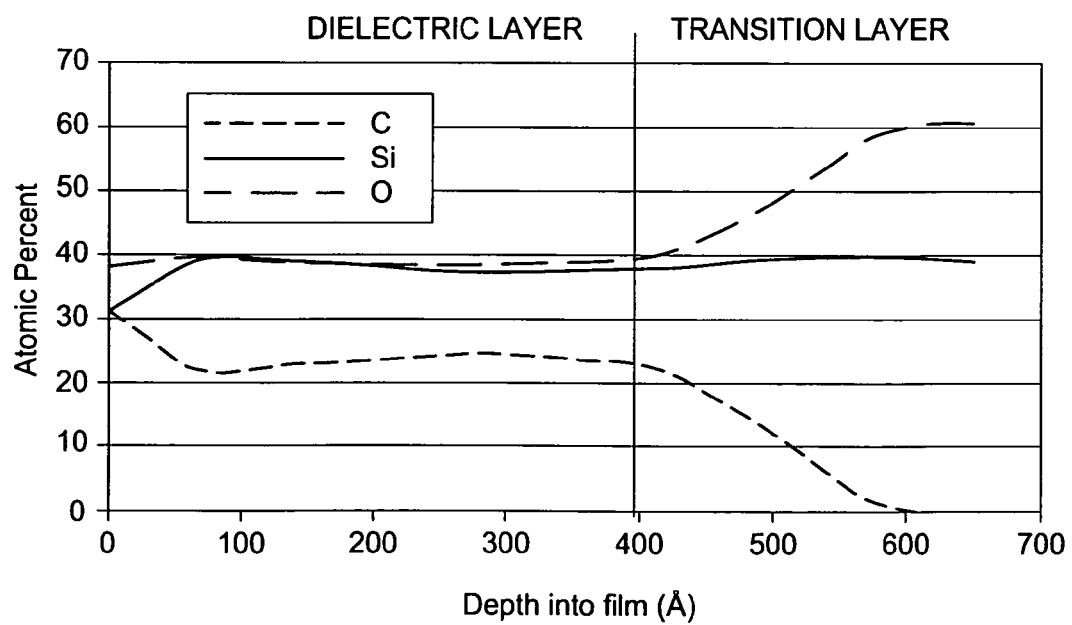
FIG. 4 is a graph illustrating the atomic percent composition (excluding hydrogen) of a transition layer and dielectric layer deposited according to an embodiment of the invention.

It is believed that the method of depositing a transition layer described herein improves the adhesion between a barrier layer, such as a silicon and carbon-containing barrier layer, and a subsequently deposited dielectric layer by providing a surface adjacent the barrier layer that is more oxygen rich than the subsequently deposited dielectric layer and is less carbon rich than the subsequently deposited dielectric layer. A graph showing the atomic percent composition (excluding hydrogen) of a transition layer and dielectric layer deposited according to an embodiment of the invention is shown in FIG. 4. FIG. 4 shows that the region of the transition layer which is first deposited, i.e., the surface of the transition layer adjacent the underlying barrier layer, has a low carbon content of only a few atomic % and a high oxygen content of about 60%. The oxygen content of the transition layer gradually decreases to about 40 atomic % and the carbon content gradually increases to about 25 atomic % in the region of the transition layer adjacent the dielectric layer. As shown in FIG. 4, the region of the transition layer adjacent the dielectric layer has an atomic % composition that is substantially similar to the atomic % composition of the dielectric layer.

By initially depositing the transition layer at a first organosilicon compound to oxidizing gas flow rate ratio of at least about 1:40, a transition layer having a low initial concentration of carbon, e.g., about 0 atomic % excluding hydrogen, and a high initial concentration of oxygen at a surface of the transition layer adjacent the barrier layer, e.g., about 60 atomic % excluding hydrogen, is provided. An oxygen concentration gradient and a carbon concentration gradient are produced in the transition layer by ramping up the organosilicon flow rate from the first organosilicon compound to oxidizing gas flow rate ratio to a second organosilicon compound to oxidizing gas flow rate ratio during the deposition of the transition layer. As the organosilicon flow rate is ramped up until the flow rate used to deposit the dielectric layer is reached, the dielectric layer may be deposited in situ, i.e., in the same chamber, immediately after the deposition of the transition layer. Thus, substrate throughput is improved as there is no need to transfer the substrate to another chamber and stabilize the processing conditions in another chamber in order to deposit the dielectric layer after the deposition of the transition layer.

While the foregoing is directed to embodiments of the present invention, other and further embodiments of the invention may be devised without departing from the basic scope thereof, and the scope thereof is determined by the claims that follow.

What is claimed is:

1. A method of depositing a dielectric layer, comprising:
introducing a processing gas comprising an organosilicon compound and an oxidizing gas into a chamber at a first organosilicon compound to oxidizing gas flow rate ratio of at least about 1:40;
turning on RF power in the chamber;
depositing a transition layer on a substrate in the chamber while ramping up the flow rate of the organosilicon compound into the chamber to provide a second organosilicon compound to oxidizing gas flow rate ratio; and
depositing a dielectric layer comprising silicon, oxygen, and carbon on the transition layer for a period of time while maintaining the second organosilicon compound to oxidizing gas flow rate ratio.

2. The method of claim 1, wherein the organosilicon compound is octamethylcyclotetrasiloxane.

3. The method of claim 2, wherein the oxidizing gas is oxygen.

4. The method of claim 1, further comprising depositing a barrier layer on the substrate before depositing the transition layer.

5. The method of claim 1, wherein the first organosilicon compound to oxidizing gas flow rate ratio is between about 1:40 and about 1:5.

6. The method of claim 5, wherein the second organosilicon compound to oxidizing gas flow rate ratio is between about 1:1 and about 3:1.

7. The method of claim 1, wherein the first organosilicon compound to oxidizing gas flow rate ratio is about 1:10 and the second organosilicon compound to oxidizing gas flow rate ratio is about 2:1.

8. The method of claim 1, wherein the transition layer is deposited under conditions sufficient to provide an oxygen concentration gradient in the transition layer.

9. The method of claim 8, wherein the concentration of the oxygen in the transition layer decreases as the layer is deposited.

10. The method of claim 1, wherein the transition layer is deposited under conditions sufficient to provide a carbon concentration gradient in the transition layer.

11. The method of claim 10, wherein the concentration of the carbon in the transition layer increases as the layer is deposited.

12. A method of depositing a dielectric layer, comprising:
introducing a processing gas comprising an organosilicon compound and an oxidizing gas into a chamber at a first organosilicon compound to oxidizing gas flow rate ratio of at least about 1:40;
turning on RF power in the chamber;
depositing a transition layer on a substrate in the chamber while ramping up the flow rate of the organosilicon compound into the chamber at a ramp rate between about 200 mg/min/sec and about 3000 mg/min/sec to provide a second organosilicon compound to oxidizing gas flow rate ratio; and
depositing a dielectric layer comprising silicon, oxygen, and carbon on the transition layer for a period of time while maintaining the second organosilicon compound to oxidizing gas flow rate ratio.

13. The method of claim 12, wherein the organosilicon compound is octamethylcyclotetrasiloxane and the oxidizing gas is oxygen.

14. The method of claim 12, wherein the transition layer is deposited under conditions sufficient to provide an oxygen concentration gradient and a carbon concentration gradient in the transition layer.

15. The method of claim 12, further comprising depositing a barrier layer on the substrate before depositing the transition layer.

16. A method of depositing a dielectric layer, comprising:
depositing a barrier layer comprising silicon and carbon on a substrate;
introducing a processing gas comprising an organosilicon compound and an oxidizing gas into a chamber at a first organosilicon compound to oxidizing gas flow rate ratio of at least about 1:40;
turning on RF power in the chamber;
depositing a transition layer on the substrate in the chamber to a thickness between about 80 Å and about 500 Å while ramping up the flow rate of the organosilicon compound into the chamber to provide a second organosilicon compound to oxidizing gas flow rate ratio; and
depositing a dielectric layer comprising silicon, oxygen, and carbon on the transition layer for a period of time while maintaining the second organosilicon compound to oxidizing gas flow rate ratio.

17. The method of claim 16, wherein the barrier layer is a silicon carbide, nitrogen-doped silicon carbide, oxygen-doped silicon carbide, or oxygen and nitrogen-doped silicon carbide layer.

18. The method of claim 16, wherein the organosilicon compound is octamethylcyclotetrasiloxane and the oxidizing gas is oxygen.

19. The method of claim 16, wherein the transition layer is deposited under conditions sufficient to provide an oxygen concentration gradient in the transition layer, and the concentration of the oxygen in the transition layer decreases as the layer is deposited.

20. The method of claim 19, wherein ramping up the flow rate of the organosilicon compound into the chamber to provide a second organosilicon compound to oxidizing gas flow rate ratio comprises a ramp rate between about 200 mg/min/sec and about 3000 mg/min/sec.

* * * * *

UNITED STATES PATENT AND TRADEMARK OFFICE
CERTIFICATE OF CORRECTION

PATENT NO. : 7,189,658 B2  Page 1 of 1
APPLICATION NO. : 11/123501
DATED : March 13, 2007
INVENTOR(S) : Lakshmanan et al.

It is certified that error appears in the above-identified patent and that said Letters Patent is hereby corrected as shown below:

Column 6, Line 65: Change "—(—Si(CH$_3$)$_2$—O—)$_2$" to -- —(—Si(CH$_3$)$_2$—O—)$_3$— --

Column 7, Line 17: Change "(CH$_2$CH)—SiH$_2$—CH$_3$" to --(CH$_2$=CH)—SiH$_2$—CH$_3$--

Column 7, Line 19: Change "CH$_3$)$_3$—Si—Si—(CH$_3$)$_3$" to --(CH$_3$)$_3$—Si—Si—(CH$_3$)$_3$--

Column 7, Line 21: Change "(CH$_3$)$_2$—SiH—SiH(CH$_3$)$_3$SiH—(CH$_3$)$_2$" to --(CH$_3$)$_2$—SiH—SiH(CH$_3$)$_3$—SiH—(CH$_3$)$_2$--

Signed and Sealed this

Nineteenth Day of June, 2007

JON W. DUDAS
*Director of the United States Patent and Trademark Office*